United States Patent

Akutsu et al.

[11] Patent Number: 5,939,852
[45] Date of Patent: Aug. 17, 1999

[54] STAGE FEEDING DEVICE

[75] Inventors: Kotaro Akutsu, Soka; Eiji Osanai, Yokohama; Hirohito Ito, Funabashi, all of Japan

[73] Assignee: Canon Kabushiki Kaisha, Tokyo, Japan

[21] Appl. No.: 08/919,480

[22] Filed: Aug. 28, 1997

[30] Foreign Application Priority Data

Aug. 29, 1996 [JP] Japan .................................. 8-245450

[51] Int. Cl.⁶ .............................. G05B 5/01; G05B 19/18
[52] U.S. Cl. ......................... 318/640; 318/632; 318/623; 73/662; 73/664; 364/167.01
[58] Field of Search ..................... 318/560–649; 324/757, 758, 754, 761; 356/239; 250/214; 108/20, 147; 248/566, 550, 562; 73/662, 664

[56] References Cited

U.S. PATENT DOCUMENTS

| 4,514,858 | 4/1985 | Novak | 378/34 |
|---|---|---|---|
| 4,516,253 | 5/1985 | Novak | 378/34 |
| 4,551,654 | 11/1985 | Barnum | 315/159 |
| 5,040,431 | 8/1991 | Sakino et al. | 74/479 |
| 5,060,519 | 10/1991 | Chojitani et al. | 73/662 |
| 5,179,516 | 1/1993 | Choshitani et al. | 364/167.01 |
| 5,180,958 | 1/1993 | Choshitani et al. | 318/623 |
| 5,467,720 | 11/1995 | Korenaga et al. | 108/20 |
| 5,498,973 | 3/1996 | Cavaliere et al. | 324/765 |
| 5,524,502 | 6/1996 | Osanai | 74/490.07 |
| 5,543,726 | 8/1996 | Boyette, Jr. et al. | 324/758 |
| 5,610,686 | 3/1997 | Osanai | 355/72 |

FOREIGN PATENT DOCUMENTS

| 1-185157 | 7/1989 | Japan . |
| 1-185158 | 7/1989 | Japan . |
| 5-77126 | 10/1993 | Japan . |

*Primary Examiner*—Paul Ip
*Attorney, Agent, or Firm*—Fitzpatrick, Cella, Harper & Scinto

[57] ABSTRACT

A stage feeding device has a movable guide which is guided on a reference surface of a platen to be movable in the Y-direction, a Y-linear motor for moving the movable guide in the Y-direction, a movable stage which is supported by the movable guide to be movable in the X-direction, and carries an object, and an X-linear motor for moving the movable stage in the X-direction. The stator of the X-linear motor is supported by a second stationary guide to be movable in only the Y-direction independently of the movable guide, and is moved in the Y-direction by a driving mechanism. The stator of the Y-linear motor and the second stationary guide are fixed to the base, and mount members for removing vibrations are arranged between the base and the platen.

16 Claims, 11 Drawing Sheets

STAGE FEEDING DEVICE

BACKGROUND OF THE INVENTION

The present invention relates to a feeding device for moving and positioning an object at high speed and high precision in, e.g., various measurement apparatuses and a projection exposure apparatus used in a semiconductor lithography process.

FIG. 12 shows the arrangement of a conventional feeding device. In FIG. 12, reference numeral 51 denotes a stage base, on which a Y-stage 52 as a moving mechanism in the Y-direction (the direction perpendicular to the page) is arranged. Reference numeral 53 denotes a DC servo motor which converts rotational motion into rectilinear motion by a ball screw and drives the Y-stage 52. The DC servo motor 53 is fixed to the stage base 51. Reference numeral 54 denotes an X-stage arranged on the Y-stage 52; and 55, a DC servo motor which converts rotational motion into rectilinear motion by a ball screw 56 and drives the X-stage 54. The DC servo motor 55 is fixed to the Y-stage 52. Reference numeral 1 denotes a platen for holding the stage base 51.

Reference numerals 9a and 9b denote reflecting mirrors for a laser distance measuring device. The mirrors 9a and 9b are fixed to the X-stage 54. Reference numeral 8a denotes an interferometer of the laser distance measuring device, which detects the position of the X-stage 54 in the X-direction. The interferometer 8a is fixed to the platen 1 via an attachment frame 10. Reference numeral 13 denotes mount members for supporting the platen 1 and shielding vibrations transmitted from a floor on which the device is set.

In the above-mentioned arrangement, when the Y-stage 52 and the X-stage 54 are driven, the reaction force of the inertial force produced upon acceleration/deceleration is transmitted to the platen 1.

On the other hand, Japanese Patent Publication Laid-Open No. 05-077126 discloses an arrangement in which a moving stage that includes a platen supported by a platen support means with a low rigidity, a guide means arranged on the platen, a movable stage supported by the platen and the guide means, and a driving means, arranged on the platen, for giving a thrust to the movable stage, also includes a support means, independently of the platen, for supporting the driving means.

However, in the prior art shown in FIG. 12, when the support reaction force produced upon acceleration/deceleration of a moving object is transmitted to the platen 1, natural vibrations are excited in the mechanism system supported by the mount members 13, and disturbance vibrations are transmitted to the X-stage 54, Y-stage 52, laser interferometer 8a, and the like, thus disturbing high-speed, high-precision feeding.

On the other hand, in the prior art disclosed in Japanese Patent Publication No. 05-077126, the support reaction force produced upon acceleration/deceleration of a moving object is not transmitted to the platen that mounts the moving object. Nevertheless, the stage arrangement is limited.

SUMMARY OF THE INVENTION

The present invention has been made in consideration of the above-mentioned problems, and has as its object to provide a stage feeding device which can prevent various natural vibrations that become disturbance vibrations from being excited at mount members, and can realize high-speed, high-precision stage feeding.

It is another object of the present invention to provide a stage feeding device which has a high degree of freedom in arrangement by improving the device disclosed in Japanese Patent Publication No. 05-077126.

In order to achieve the above objects, according to one aspect of the present invention, there is provided a stage feeding device comprising:

a platen having an upper surface serving as a reference surface;

a first movable member guided on the reference surface to be movable in a first direction;

first moving means for moving the first movable member in the first direction;

a second movable member guided by the second movable member to be movable in a second direction substantially perpendicular to the first direction;

second moving means for moving the second movable member in the second direction;

support means for supporting the second moving means to be movable in the first direction independently of the first movable member;

third moving means for moving the second moving means in the first direction;

a base for supporting the first moving means and the support means; and vibration removing means, arranged between the base and the platen, for preventing a vibration from being transmitted therebetween.

With the above arrangement, the inertial force produced upon acceleration/deceleration of a moving object is not transmitted to the platen, and the moving object can be fed at high speed and high precision.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
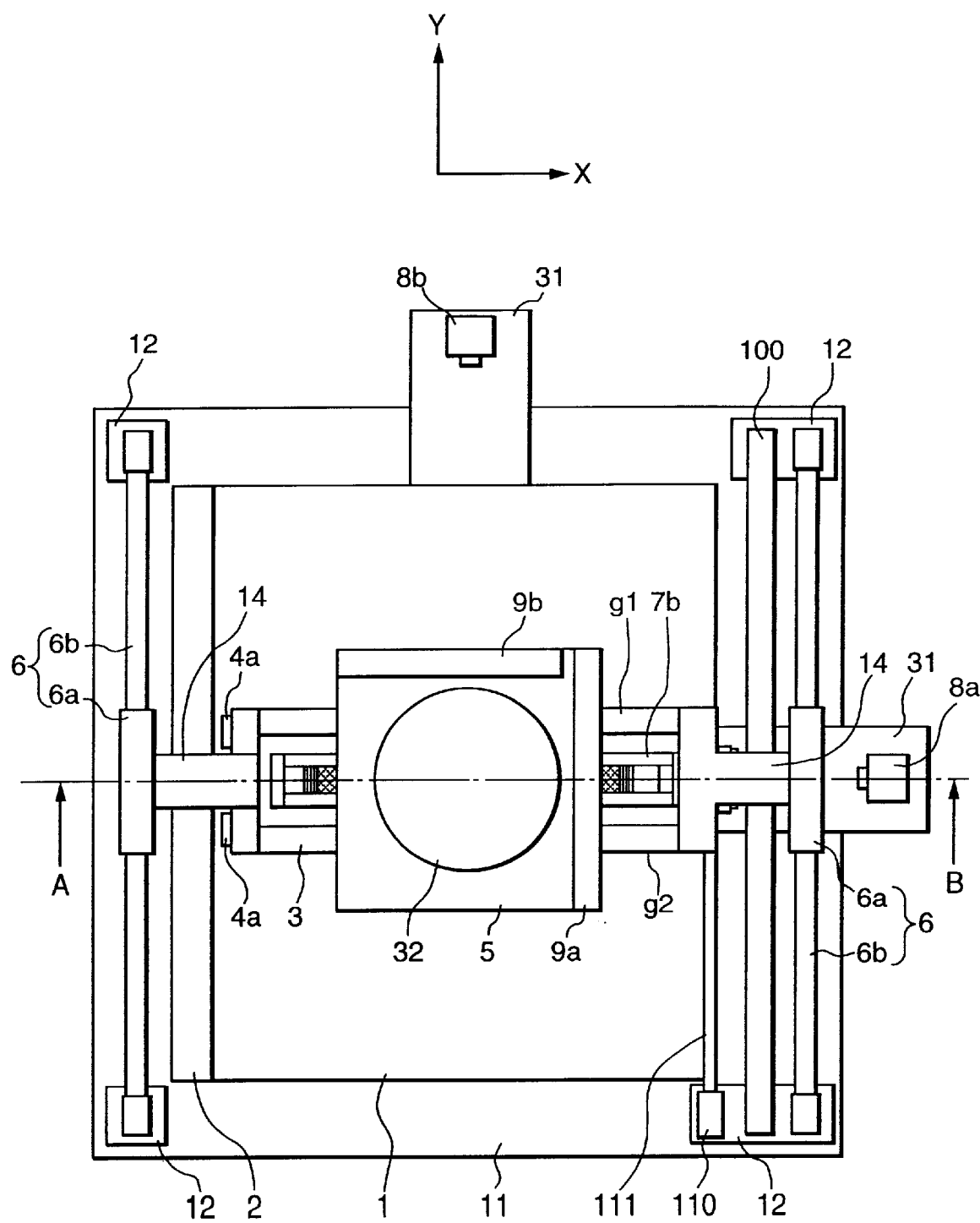
FIG. 1 is a plan view of a feeding device according to the first embodiment of the present invention.
Figure 2:
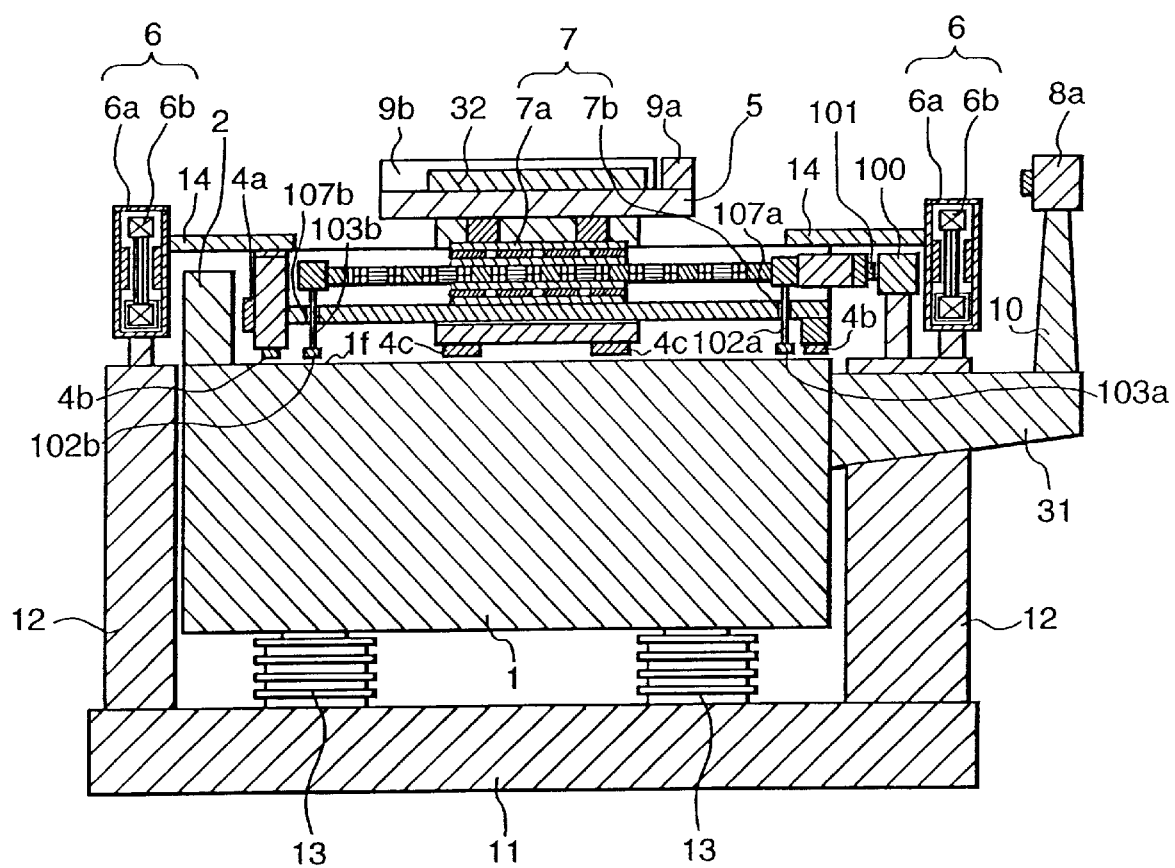
FIG. 2 is a sectional view taken along a line A–B in FIG. 1.
Figure 3:
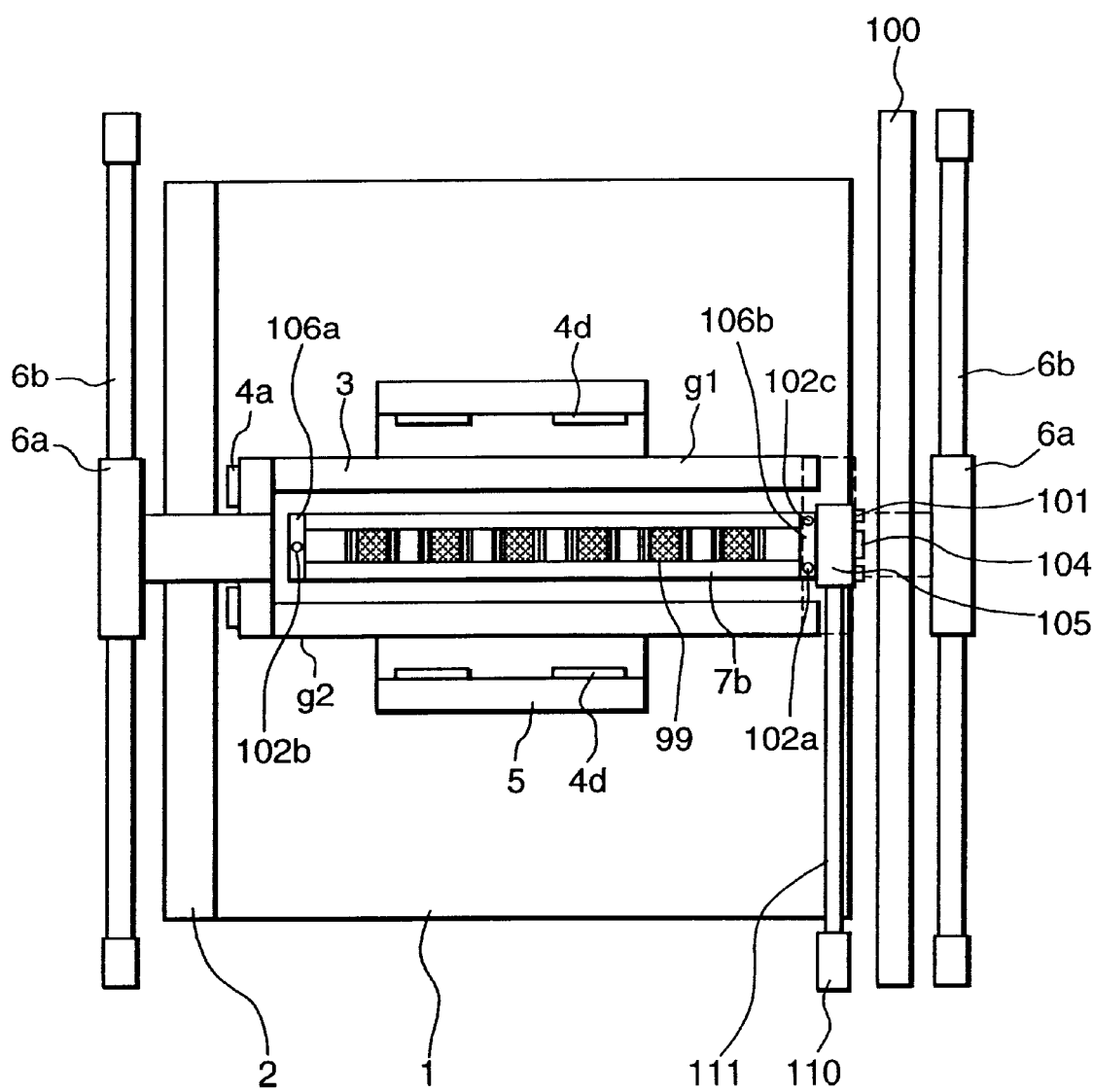
FIG. 3 is a partial plan view of FIG. 1.

FIG. 1 is a plan view showing a feeding device used in a semiconductor exposure apparatus according to the first embodiment of the present invention, FIG. 2 is a sectional view taken along a line A–B in FIG. 1, and FIG. 3 is a plan view excluding the upper portion of a movable stage 5 shown in FIG. 1.

Referring to FIGS. 1 to 3, reference numeral 1 denotes a platen, the upper surface of which serves as a guide surface 1*f*. The platen 1 supports an exposure optical system. Reference numeral 2 denotes a stationary guide which has a guide surface which is perpendicular to the guide surface 1*f* of the platen 1, and is parallel to the Y-direction. The stationary guide 2 is fixed to the platen 1. Reference numeral 3 denotes a movable guide having guide surfaces g1 and g2 which are perpendicular to the guide surface 1*f* of the platen 1 and are parallel to the X-direction. The movable guide 3 has static pressure bearing pads 4*a* and 4*b*, and is supported and guided by the guide surfaces of the platen 1 and the stationary guide 2 in a non-contact manner. Reference numeral 32 denotes a chuck for chucking an object to be exposed (not shown) by, e.g., vacuum chucking; and 5, a movable stage for holding the chuck 32. The movable stage 5 has static pressure bearing pads 4*c* that oppose the guide surface 1*f* of the platen 1, and static pressure bearing pads 4*d* that oppose the guide surfaces g1 and g2 of the movable guide 3, and is supported and guided in a non-contact manner. The static pressure bearing pads 4*a* and 4*c* are pressurized by magnet attraction, vacuum chucking, or the like (not shown). Reference numerals 9*a* and 9*b* denote reflection mirrors for a laser distance measuring device. These mirrors 9*a* and 9*b* are fixed to the movable stage 5. Reference numerals 8*a* and 8*b* denote interferometers for the laser distance measuring device. These interferometers 8*a* and 8*b* detect the position of the movable stage 5, and are fixed to the platen 1 via attachment frames 10 and attachment boards 31. Reference numeral 11 denotes a base for shielding vibrations and supporting the platen 1 via mount members 13.

Reference numeral 6 denotes two Y-linear motors for driving the movable guide 3 in the Y-direction in a non-contact manner. In these Y-linear motors 6, Y-moving elements 6*a* are coupled to both ends of the movable guide 3 via attachment plates 14, and Y-stators 6*b* are fixed to the base 11 via frames 12. Reference numeral 7 denotes an X-linear motor for driving the movable stage 5 in the X-direction in a non-contact manner. An X-moving element 7*a* of the X-linear motor 7 is coupled to the movable stage 5. An X-stator 7*b* builds a driving stage 99 together with couplers 106*a* and 106*b* and a driving plate 105. Three static pressure bearing pads 102*a*, 102*b*, and 102*c* are attached to the couplers 106*a* and 106*b* via rods 103*a*, 103*b*, and 103*c* extending through the movable guide 3. Note that an air supply portion to the individual static pressure bearing pads is not shown.

The driving stage 99 is supported and guided by the guide surface 1*f* of the platen 1 in a non-contact manner via these three static pressure bearing pads 102*a*, 102*b*, and 102*c*. The driving plate 105 is attached with two static pressure bearing pads 101 and a magnetic attraction or vacuum chucking mechanism 104. The driving stage 99 is guided by a second stationary guide 100 in the Y-direction in a non-contact manner via these pads and mechanism and is supported in the X-direction via these pads and mechanism. The driving plate 105 has a driving mechanism 111 for driving the driving stage 99 in the Y-direction with reference to the frames 12. The driving mechanism 111 may adopt, e.g., a ball screw.

Reference numeral 110 denotes a position detector for detecting the position of the driving stage 99 in the Y-direction. The position detector 110 may comprise, e.g., an encoder. With the above-mentioned arrangement, the driving stage 99 can move in the Y-direction independently of the moveable guides 3 and 5 within the range (±δ) of through holes 107*a* and 107*b* of the movable guide 3. Also, the movement of the driving stage 99 does not influence the movable guides 3 and 5.

Figure 4:
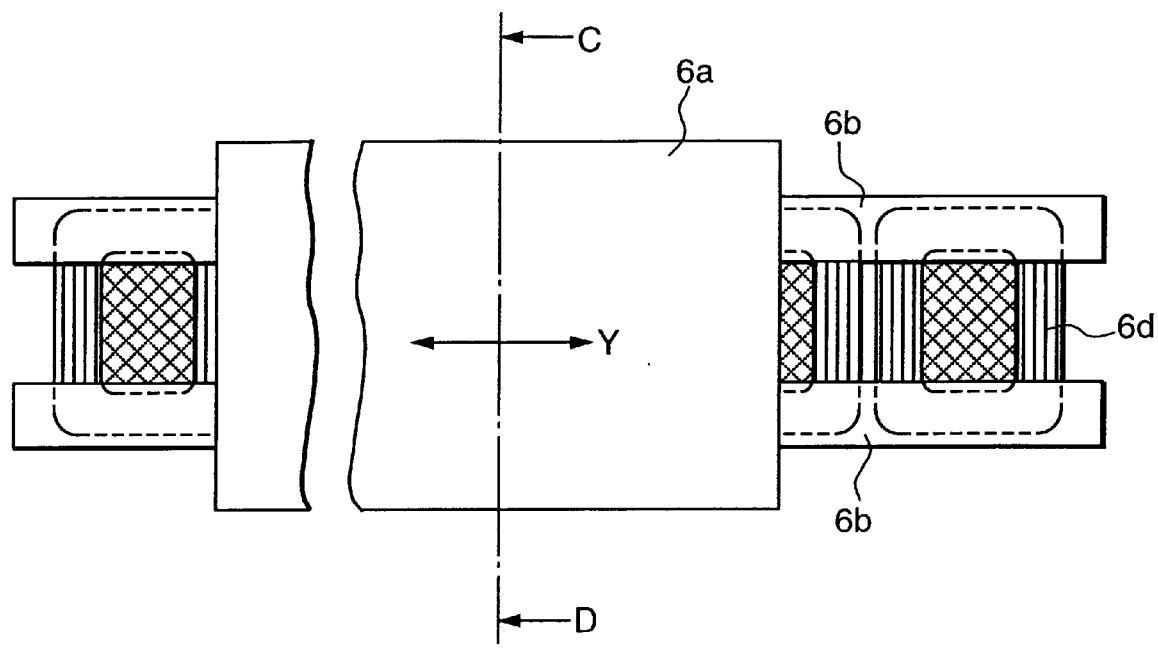
FIG. 4 is a partial enlarged view of a Y-linear motor in the device shown in FIG. 1.
Figure 5:
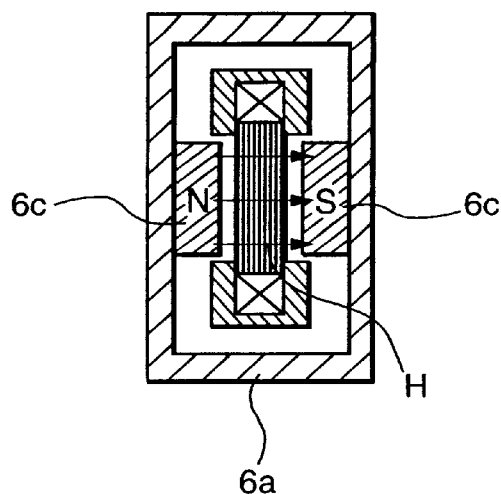
FIG. 5 is a sectional view taken along a line C–D in FIG. 4.

FIG. 4 is a partial enlarged view of each Y-linear motor 6, and FIG. 5 is a sectional view taken along a line C–D in FIG. 4. The Y-moving element 6*a* is attached with a plurality of pairs of permanent magnets 6*c* which consist of a magnetic material and have opposing N and S poles, and serves as a magnetic circuit that delivers magnetic fluxes indicated by arrows H. A plurality of coils 6*d* are fixed to the Y-stator 6*b*, and are arranged to be located in a space opposing the permanent magnets 6*c*. The X-linear motor 7 has a similar arrangement to that of the Y-linear motor 6. These linear motors are heteropolar linear motors disclosed in Japanese Patent Laid-Open Nos. 01-185157 and 01-185158.

Figure 6:
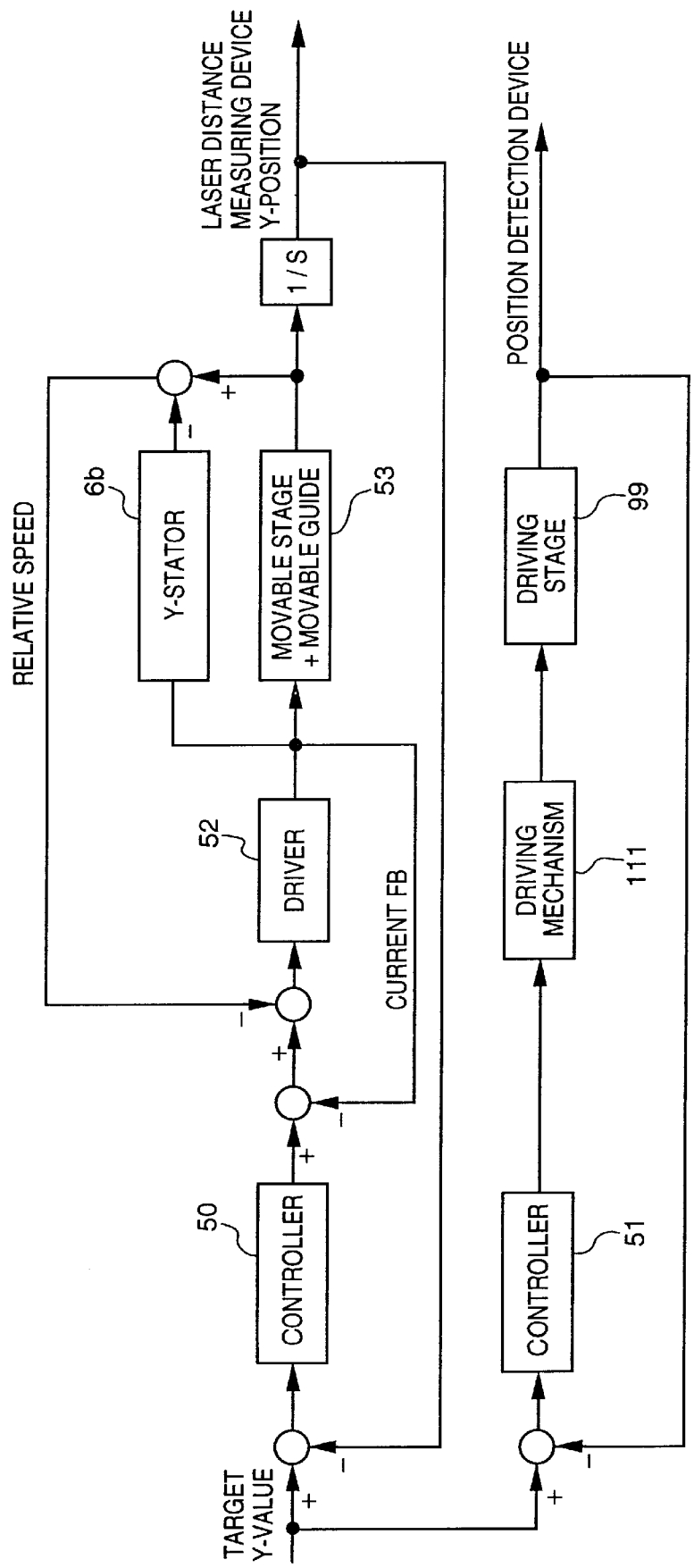
FIG. 6 is a block diagram of a control arrangement for driving a movable stage and a driving stage of the device shown in FIG. 1 in the Y-direction.

FIG. 6 is a block diagram showing a control arrangement for driving the movable stage 5 and the driving stage 99 in the Y-direction. Reference numeral 50 denotes a controller for driving the movable stage 5 and the driving stage 99 in the Y-direction; and 52, a driver for supplying currents to the Y-linear motor coils 6*d*. An electromagnetic force corresponding to the current amount supplied from the driver 52 drives the movable stage 5 and the movable guide 3 in the Y-direction, and its reaction force acts on the frame 12 via each Y-stator 6*b*. At that time, when the Y-stator 6*b* vibrates and a relative speed with respect to the corresponding Y-moving element 6*a* is produced, an induced voltage is generated in the coils 6*d*. However, since the driver 52 maintains currents to be supplied to the coils 6*d* to be a value corresponding to an instruction signal, the vibrations of the Y-stator 6*b* are not transmitted to the Y-moving element 6*a*. The current amount from the driver 52 becomes a value corresponding to the deviation between the Y-position and the Y target position of the movable stage 5 by feeding back the Y-position as the output signal of the laser distance measuring device that measures the Y-position to the controller 50. In this manner, the driving of the movable stage 5 and the movable guide 3 in the Y-direction is controlled.

In order to control the driving stage 99 to follow the movable guide 3, a target Y-value common to the movable stage 5 is used, and the output signal from the encoder as the position detector 110 is used as a feedback signal of the driving stage 99, thereby controlling the driving of the driving stage 99. Reference numeral 51 denotes a controller for controlling the driving mechanism 111 using a ball screw on the basis of the deviation between the target Y-value and the feedback signal. The driving stage 99 need only follow the movable guide 3 with errors about ⅓ to ¼ of the range (±δ), wherein δ represents a radius of holes 107*a* and 107*b*.

In the above-mentioned arrangement, when a predetermined target Y-value or target pattern is input, the movable stage 5 and the movable guide 3 make a predetermined motion in the Y-direction. At this time, the driving stage 99 makes a predetermined motion to roughly follow the movable guide 3. The inertial force produced upon acceleration/deceleration when the movable stage 5 and the movable guide 3 are driven in the Y-direction is transmitted to the frames 12 via the stators 6b of the linear motors as the reaction force in the Y-direction, but is not transmitted to the platen 1 since the frames 12 are supported by the base 11. On the other hand, the inertial force produced upon acceleration/deceleration when the movable stage 5 is driven in the X-direction is transmitted to the driving stage 99 including the X-stator 7b of the linear motor as a reaction force in the X-direction, and is transmitted to the frames 12 via the static pressure bearing pads 101 and the second stationary guide 100, but is not transmitted to the platen 1 since the frames 12 are supported by the base 11. Hence, no natural vibrations are excited in the mechanism system supported by the mount members 13, and no disturbance vibrations are transmitted to the movable stage 5 and the laser interferometers 8a and 8b.

Second Embodiment

Figure 7:
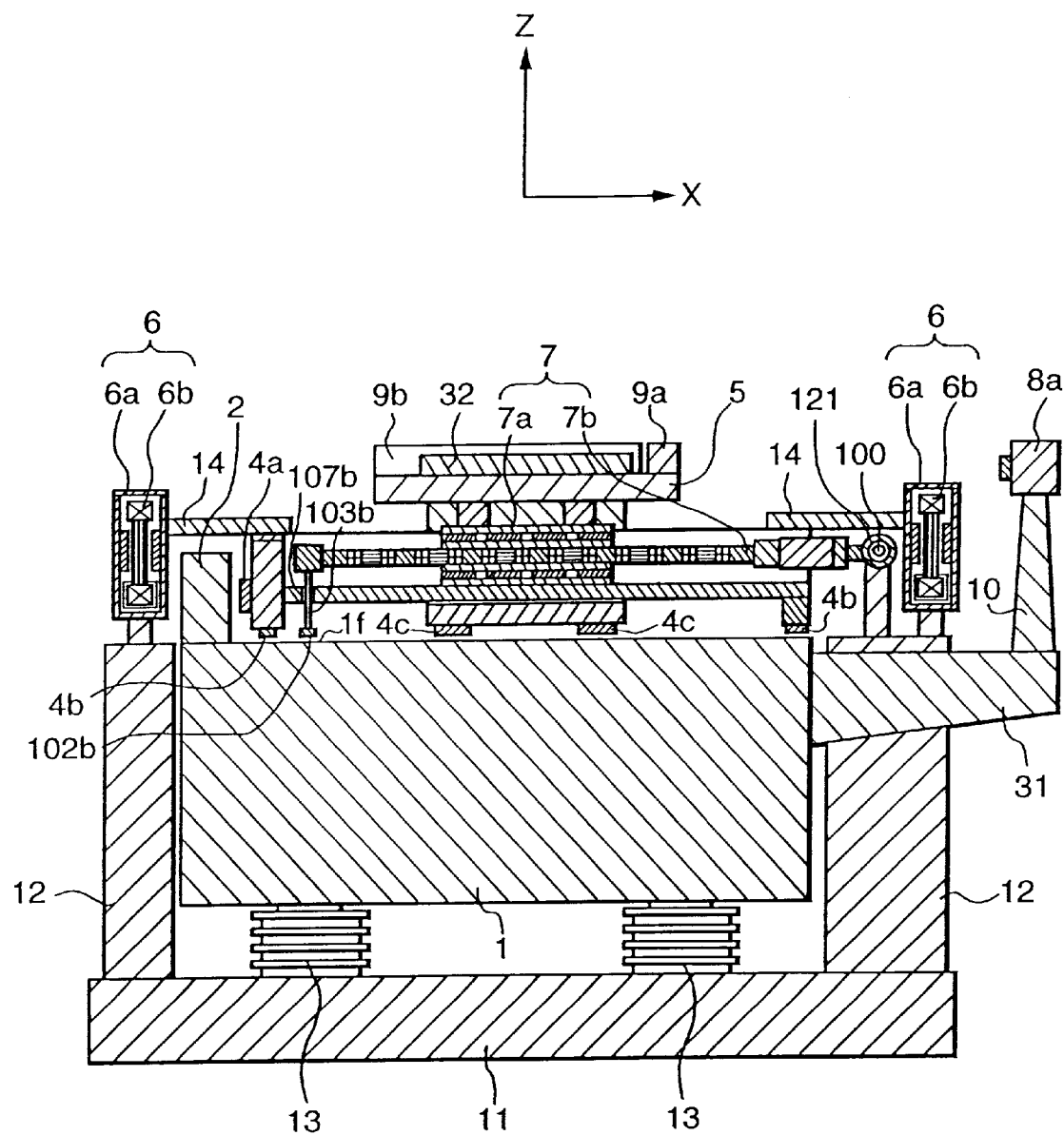
FIG. 7 is a sectional view of a feeding device according to the second embodiment of the present invention.
Figure 8:
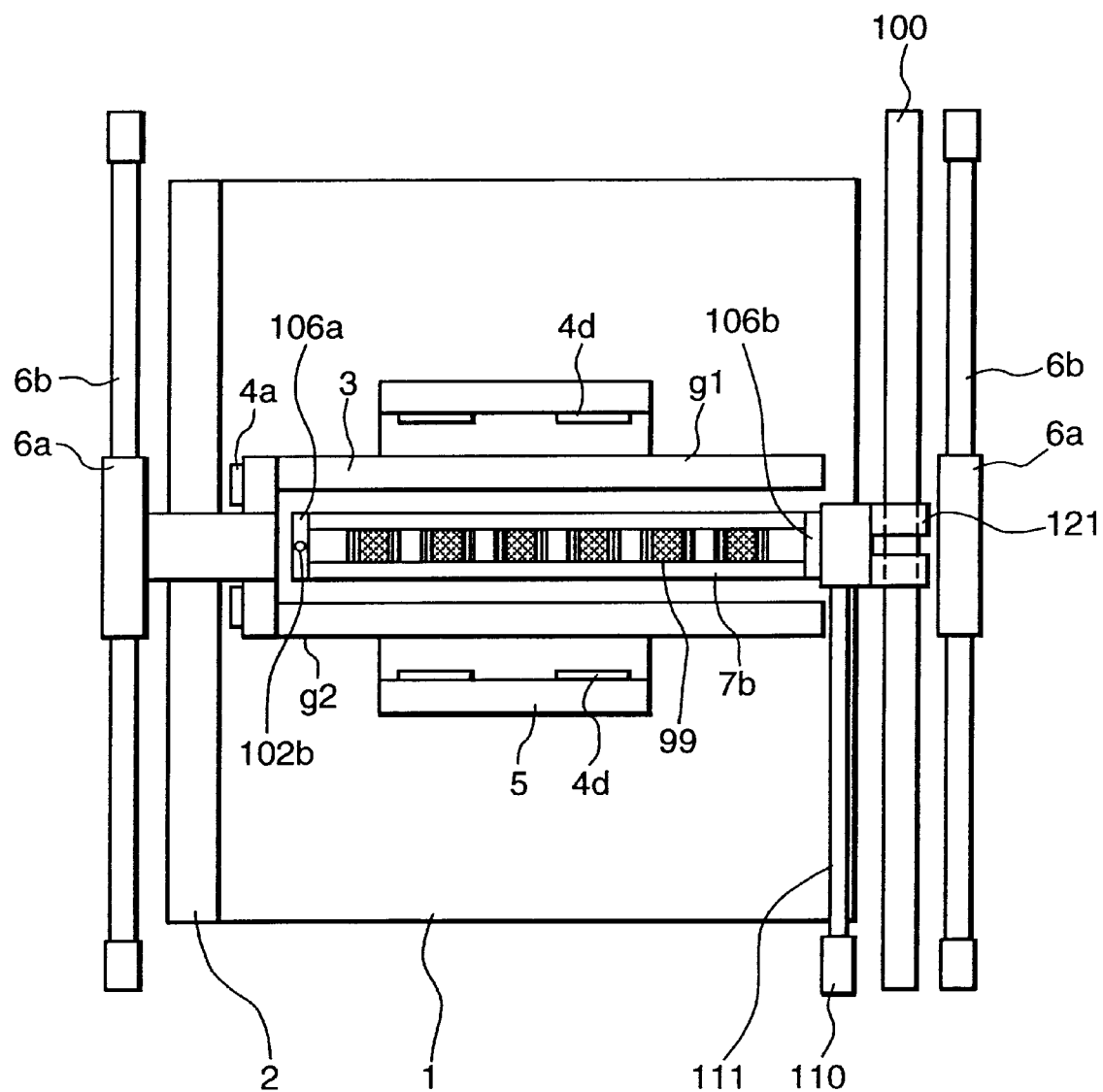
FIG. 8 is a partial plan view of the device shown in FIG. 7.

In the first embodiment, in order to guide the driving stage 99, the guide surface 1f of the platen 1 is used as a reference, and the three static pressure bearing pads 102a, 102b, and 102c are arranged to oppose the guide surface 1f. In addition, the second stationary guide 100 is used as a reference, and the two static pressure bearing pads 101 are arranged to oppose the second stationary guide 100. However, instead, full constraint cylindrical type static pressure bearings 121 are arranged on the second stationary guide 100, as shown in FIGS. 7 and 8 to build a guide mechanism together with a single static pressure bearing pad 102b that opposes the guide surface 1f of the platen 1.

Third Embodiment

Figure 9:
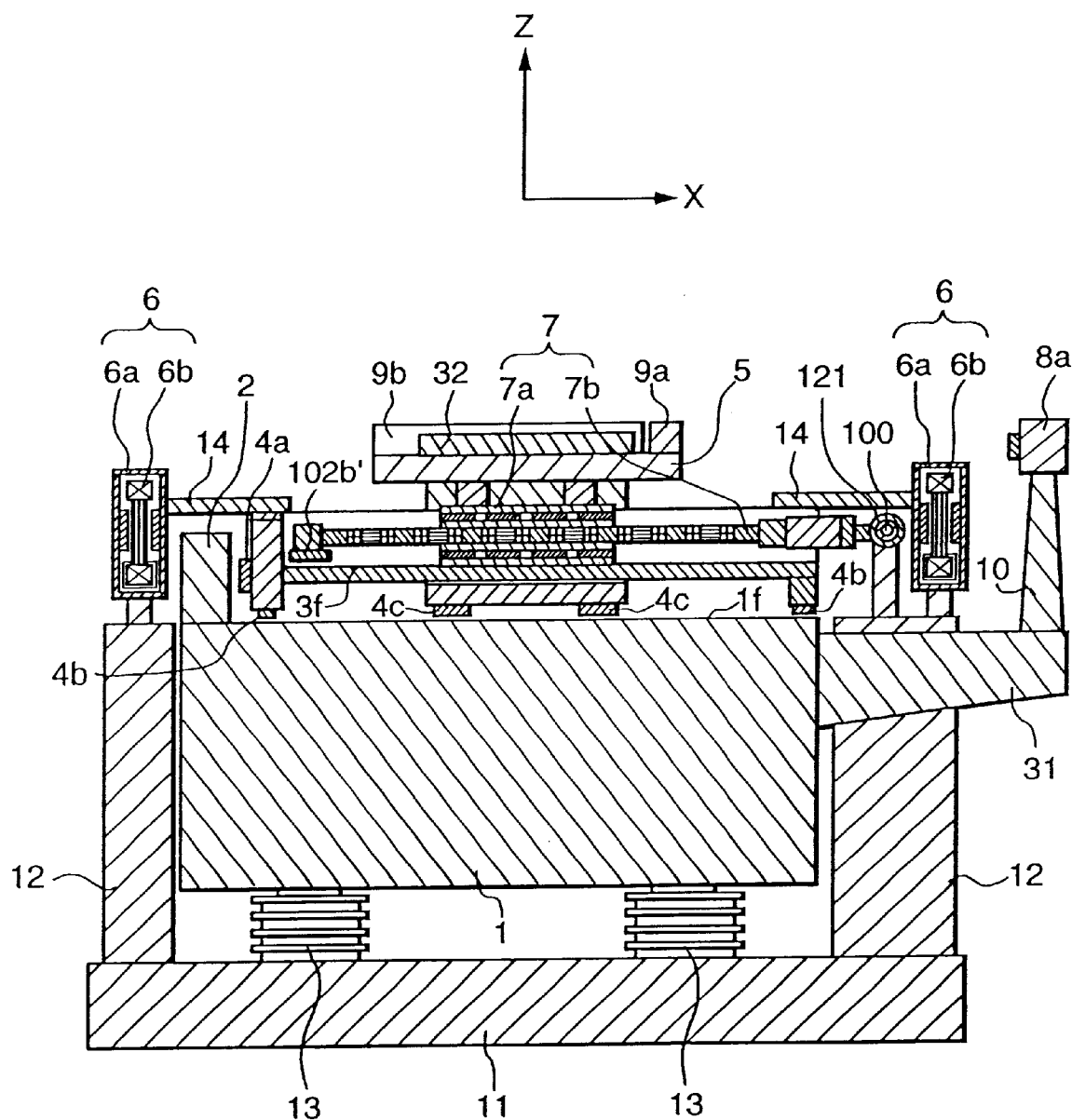
FIG. 9 is a sectional view of a feeding device according to the third embodiment of the present invention.

Furthermore, in place of using, as a reference, the guide surface 1f of the platen 1, as shown in FIG. 9, an upper surface 3f of the movable guide 3 may be used as a reference, and the driving stage 99 may be guided by a single static pressure bearing pad 102b' that opposes the upper surface 3f. With this arrangement, the need for forming the through holes 107 on the movable guide 3 can be obviated, and assembly becomes easier.

Fourth Embodiment

Figure 10:
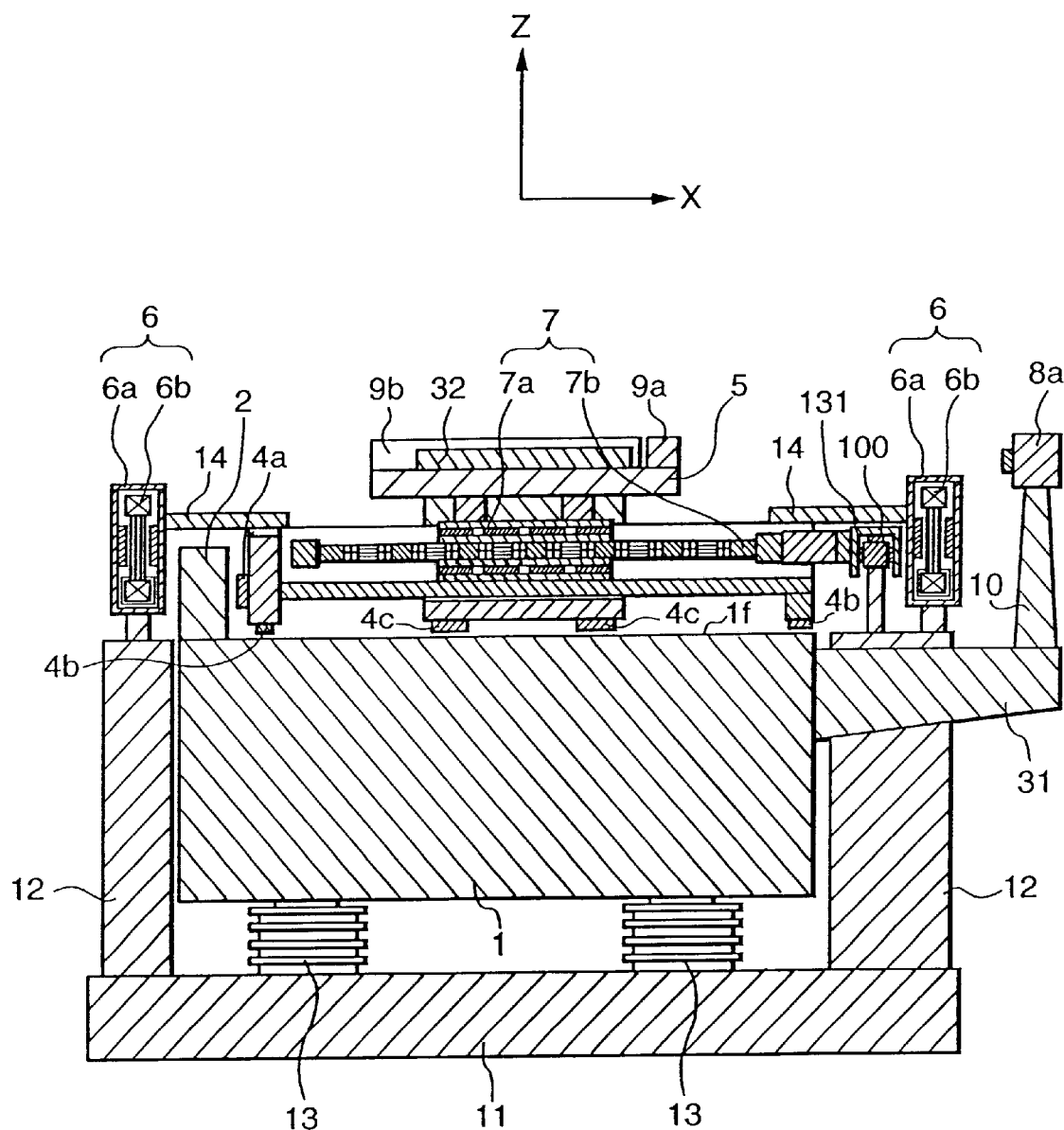
FIG. 10 is a sectional view of a feeding device according to the fourth embodiment of the present invention.

As shown in FIG. 10, a rectangular static pressure bearing mechanism 131 may be used to support and guide the driving stage 99 at a position above the guide 100. With this arrangement, all the degrees of freedom (X, Z, X-axis rotation, Y-axis rotation, Z-axis rotation) of the driving stage 99 except for the Y-direction can be restrained by the rectangular static pressure bearing mechanism 131 alone, and the need for the static pressure bearing pads 102a, 102b, 102c, and 102b' used in the second and third embodiments can be obviated.

Fifth Embodiment

Figure 11:
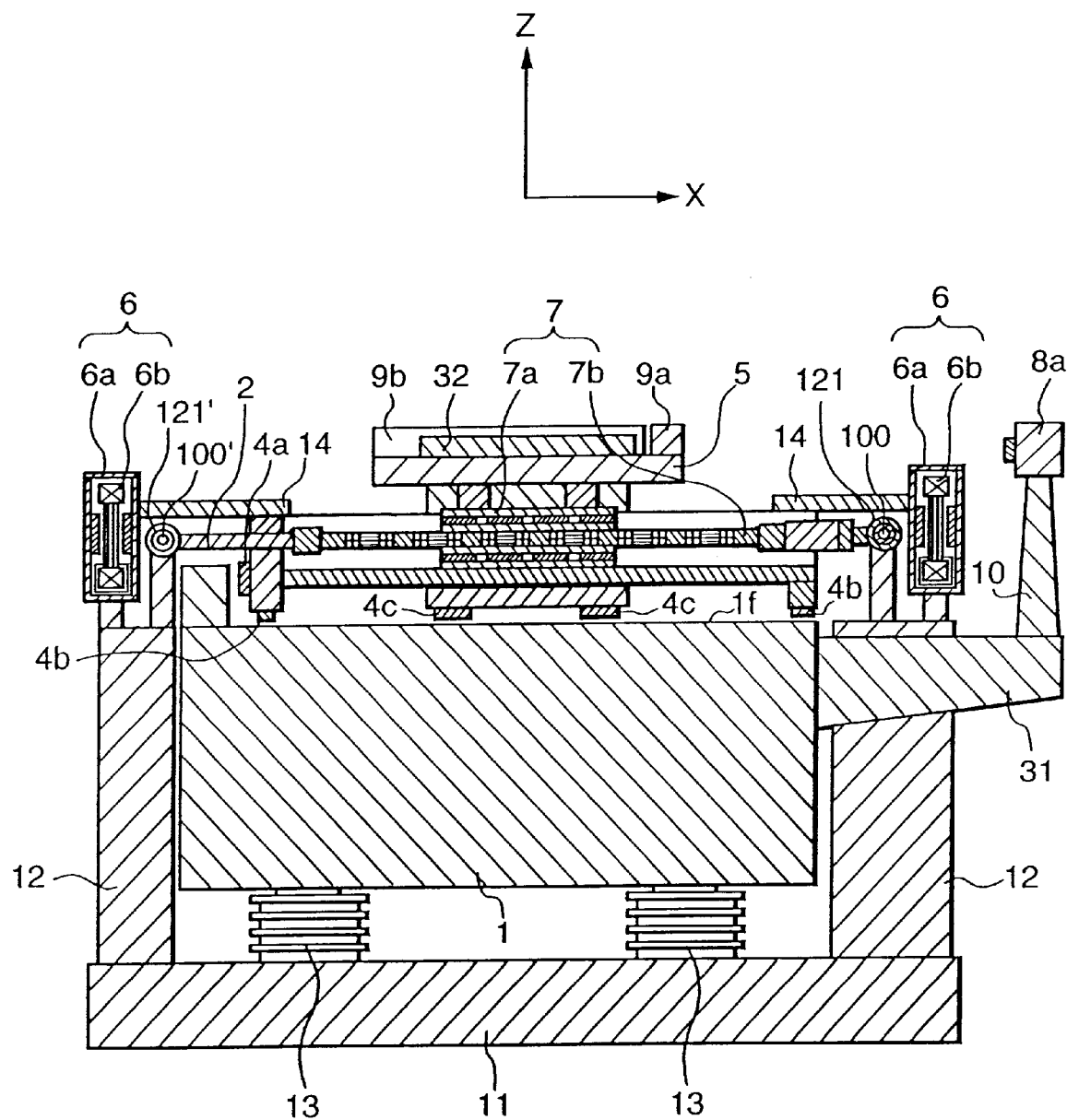
FIG. 11 is a sectional view of a feeding device according to the fifth embodiment of the present invention.
Figure 12:
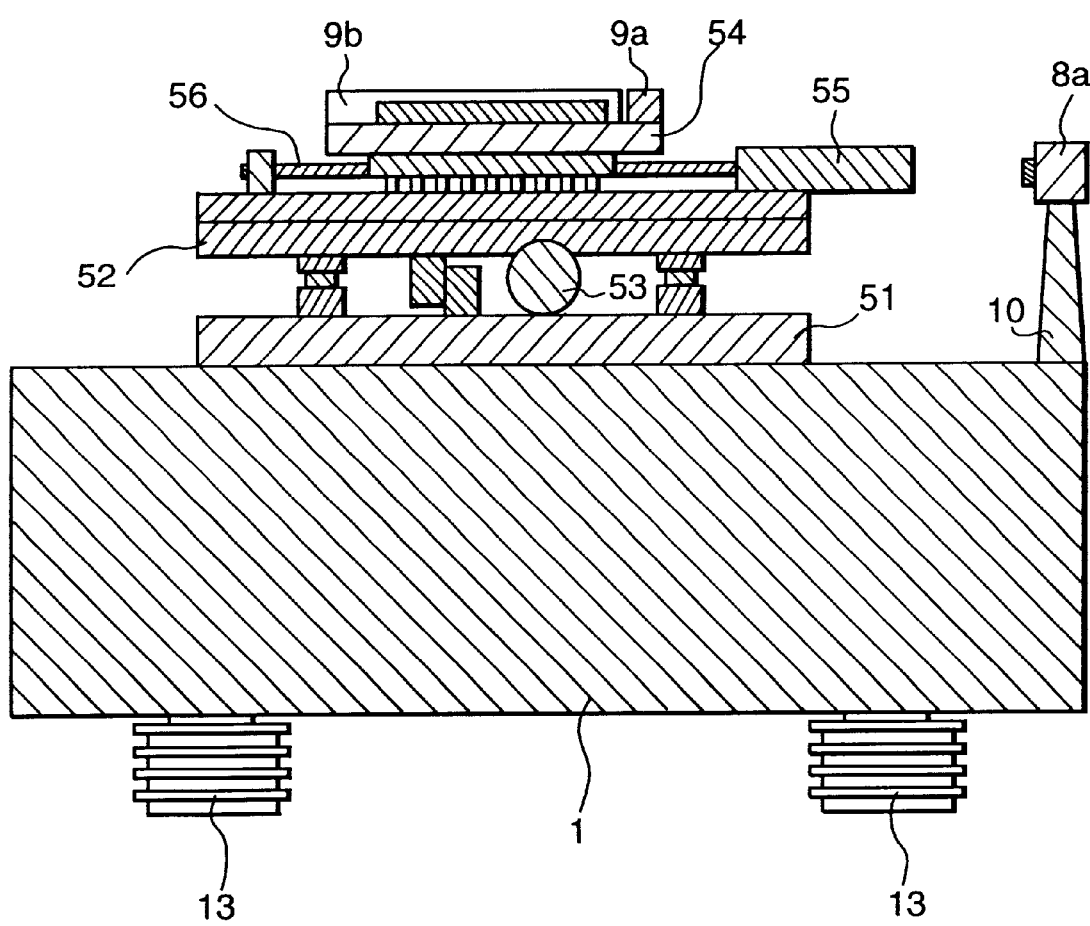
FIG. 12 is a view showing the arrangement of a conventional feeding device.

As shown in FIG. 11, second stationary guides 100 and 100' may be arranged on both sides of the platen 1, and the driving stage 99 may be supported by full constraint cylindrical static pressure bearings 121 and 121' arranged on these guides. According to this embodiment, the need for the static pressure bearing pads can be obviated as in the fourth embodiment.

Sixth Embodiment

In the first embodiment, the ball screw is used as the driving mechanism 111 of the driving stage 99.

Alternatively, when higher precision is required, for example, heteropolar type linear motors used in the first embodiment may be used as a non-contact actuator.

According to the above embodiments, a first moving means (e.g., the stators 6b of the linear motors for Y-driving) is supported and fixed by the base 11 separated by the platen 1 that supports a second movable member (e.g., the movable stage 5) and the laser interferometers, and a vibration removing means (the mount members 13). Furthermore, a second moving means (e.g., the stator 7b of the linear motor for X-driving) is supported by the second stationary guide 100 in a second direction (X-direction) so as to be movable in a first direction (Y-direction) independently of a first movable member (e.g., the movable guide 3). Furthermore, the second moving means is driven to roughly follow motion of the first movable member in the first direction. With this arrangement, an inertial force produced upon acceleration/deceleration of the first and second movable members is never transmitted to the platen 1. For this reason, various natural vibrations that become disturbance vibrations are not excited, and high-speed, high-precision feeding can be achieved.

As many apparently widely different embodiments of the present invention can be made without departing from the spirit and scope thereof, it is to be understood that the invention is not limited to the specific embodiments thereof except as defined in the claims.

What is claimed is:

1. A stage feeding device comprising:

a platen having an upper surface serving as a reference surface;

a first movable member guided on the reference surface to be movable in a first direction;

first moving means for moving said first movable member in the first direction;

a second movable member guided by said first movable member to be movable in a second direction substantially perpendicular to the first direction;

second moving means for moving said second movable member in the second direction;

support means for supporting said second moving means to be movable in the first direction independently of said first movable member;

third moving means for moving said second moving means in the first direction;

a base for supporting said first moving means and said support means; and vibration removing means, arranged between said base and said platen, for preventing a vibration from being transmitted therebetween.

2. The device according to claim 1, wherein said first, second, and third moving means move an object to be moved in a direction parallel to the reference surface.

3. The device according to claim 1, wherein said third moving means moves said second moving means to substantially follow motion of said first movable member by said first moving means.

4. The device according to claim 1, wherein said first and second movable members are supported on the reference surface of said platen via a static pressure bearing.

5. The device according to claim 1, wherein said first movable member is supported, via a static pressure bearing, on a side surface, extending in the first direction perpendicular to the reference plane, of a first stationary guide fixed to said platen.

6. The device according to claim 1, wherein said second movable member is mounted on said first movable member while being supported on a side surface, extending in the second direction perpendicular to the reference surface, of said first movable member.

7. The device according to claim 1, wherein said first moving means comprises a linear motor for generating a thrust by an electromagnetic force, a movable portion of said linear motor is coupled to said first movable member, and a stationary portion of said linear motor is coupled to said base.

8. The device according to claim 1, wherein said second moving means comprises a linear motor for generating a thrust by an electromagnetic force, a movable portion of said linear motor is coupled to said second movable member, and a stationary portion of said linear motor is supported by said support means.

9. The device according to claim 1, wherein said third moving means moves said second moving means in the first direction in accordance with a target movement value instructed to said first moving means.

10. The device according to claim 1, wherein said support means comprises a second stationary guide fixed to said base, and a static pressure bearing that uses a guide surface of said second stationary guide as a bearing surface.

11. The device according to claim 1, wherein said third moving means is supported, via a static pressure bearing, on a guide surface, extending in the first direction, of a second stationary guide fixed to said base, and is supported on the reference surface via at least three static pressure bearings.

12. The device according to claim 1, wherein said third moving means is supported on a second stationary guide fixed to said base via a full constraint cylindrical static pressure bearing, and is supported on the reference surface via at least one static pressure bearing.

13. The device according to claim 1, wherein said third moving means is supported on a second stationary guide fixed to said base via a full constraint cylindrical static pressure bearing, and is supported on an upper surface of said first movable member via at least one static pressure bearing.

14. The device according to claim 1, wherein said third moving means is supported, via a static pressure bearing mechanism, on an upper surface and a side surface of a second stationary guide having a rectangular section and fixed to said base.

15. The device according to claim 1, wherein two ends of said third moving means are supported on two parallel second stationary guides fixed to said base and extending in the first direction via static pressure bearing mechanisms.

16. The device according to claim 1, wherein said platen supports an exposure optical system, and said second movable member comprises a stage that carries an object to be exposed.

* * * * *